(12) United States Patent
Kawase et al.

(10) Patent No.: US 10,594,403 B2
(45) Date of Patent: Mar. 17, 2020

(54) OPTICAL TRANSCEIVER AND METHOD FOR ESTIMATING TEMPERATURE OF SAME

(71) Applicant: SUMITOMO ELECTRIC INDUSTRIES, LTD., Osaka-shi, Osaka (JP)

(72) Inventors: Daisuke Kawase, Osaka (JP); Daisuke Umeda, Osaka (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

(21) Appl. No.: 16/310,896

(22) PCT Filed: Jun. 1, 2017

(86) PCT No.: PCT/JP2017/020496
§ 371 (c)(1),
(2) Date: Dec. 18, 2018

(87) PCT Pub. No.: WO2017/221666
PCT Pub. Date: Dec. 28, 2017

(65) Prior Publication Data
US 2019/0181954 A1 Jun. 13, 2019

(30) Foreign Application Priority Data

Jun. 23, 2016 (JP) ................................. 2016-124387

(51) Int. Cl.
*H04B 10/40* (2013.01)
*H01S 5/022* (2006.01)
(Continued)

(52) U.S. Cl.
CPC ............. *H04B 10/40* (2013.01); *H01S 5/022* (2013.01); *H01S 5/02248* (2013.01);
(Continued)

(58) Field of Classification Search
None
See application file for complete search history.

(56) References Cited

U.S. PATENT DOCUMENTS

| 2009/0010655 A1* | 1/2009 | Schulz | ............... H01S 5/02415 398/136 |
| 2011/0103792 A1* | 5/2011 | Kimura | ............... H04B 10/032 398/2 |
| 2012/0082462 A1* | 4/2012 | Mariotti | ............... H04B 10/40 398/135 |

FOREIGN PATENT DOCUMENTS

| JP | 2006-222868 A | 8/2006 |
| JP | 2006222868 A * | 8/2006 |

(Continued)

*Primary Examiner* — David W Lambert
(74) *Attorney, Agent, or Firm* — Drinker Biddle & Reath LLP

(57) ABSTRACT

An optical transceiver of the present disclosure includes: a first light emitting element configured to perform electric-optic conversion at a first transmission rate; a second light emitting element configured to perform electric-optic conversion at a second transmission rate higher than the first transmission rate; a light receiving element configured to perform optic-electric conversion at a predetermined transmission rate; an optical sub-assembly accommodating the light emitting elements and the light receiving element; a circuit board having a plurality of integrated circuits which are configured to drive the light emitting elements and the light receiving element; a housing accommodating the optical sub-assembly and the circuit board, the housing having a longest dimension in a longitudinal direction thereof and having thermal conductivity; a temperature sensor configured to detect a temperature inside the housing; a temperature control unit configured to determine a control value to be designated to the integrated circuit that corresponds at least one target element among the light emitting elements and the light receiving element, in accordance with a detection temperature detected by the temperature sensor; and a light emission control unit configured to set a light emission state of an apparatus to which the light emission control unit (Continued)

belongs, to any of states 1 to 3 below. The optical subassembly is disposed at one end side in the longitudinal direction with respect to a main heat generation member among the plurality of integrated circuits, and the temperature sensor is disposed at another end side in the longitudinal direction with respect to the heat generation member. State 1: a state in which the first light emitting element is ON and the second light emitting element is OFF; state 2: a state in which the first light emitting element is ON and the second light emitting element is ON; and state 3: a state in which the first light emitting element is OFF and the second light emitting element is ON.

9 Claims, 12 Drawing Sheets

(51) Int. Cl.
*H01S 5/024* (2006.01)
*H01S 5/068* (2006.01)
*H01S 5/40* (2006.01)
*H04B 10/07* (2013.01)
*G02B 6/42* (2006.01)
*G01K 13/00* (2006.01)

(52) U.S. Cl.
CPC ...... *H01S 5/02415* (2013.01); *H01S 5/06804* (2013.01); *H01S 5/4025* (2013.01); *H04B 10/07* (2013.01); *G01K 13/00* (2013.01); *G02B 6/4271* (2013.01); *G02B 6/4286* (2013.01)

(56) References Cited

FOREIGN PATENT DOCUMENTS

| JP | 2011-97257 A | 5/2011 |
| JP | 2014-109604 A | 6/2014 |

\* cited by examiner

FIG. 9

DEVICE CONTROL LUT

| Tdevice | 1G MODULATION AMPLI-TUDE CONTROL VALUE (Tmon+$\Delta T_{Tx1G2}$) | 1G LD BIAS CONTROL VALUE (Tmon+$\Delta T_{Tx1G2}$) | APD BIAS CONTROL VALUE (Tmon+$\Delta T_{Rx}$) | ... |
|---|---|---|---|---|
| ... | | | | |
| 25°C | | | | |
| ... | | | | |
| 70°C | | | | |
| ... | | | | |
| 100°C | | | | |

TEMPERATURE CORRECTION LUT

| STATE | Tx10G & TEC | Tx1G | CORRECTION VALUE $\Delta T_{Tx1G}$ | CORRECTION VALUE $\Delta T_{Rx}$ |
|---|---|---|---|---|
| 1 | OFF | ON | $\Delta T_{Tx1G1}$ | $\Delta T_{RX1}$ |
| 2 | ON | ON | $\Delta T_{Tx1G2}$ | $\Delta T_{RX2}$ |
| 3 | ON | OFF | $\Delta T_{Tx1G3}$ | $\Delta T_{RX3}$ |

OPTICAL TRANSCEIVER AND METHOD FOR ESTIMATING TEMPERATURE OF SAME

TECHNICAL FIELD

The present invention relates to an optical transceiver provided with a light emitting element and a light receiving element, and relates to a method for estimating the temperature of the optical transceiver.

This application claims priority on Japanese Patent Application No. 2016-124387 filed on Jun. 23, 2016, the entire content of which is incorporated herein by reference.

BACKGROUND ART

PATENT LITERATURE 1 describes a pluggable optical transceiver to be used in a 10G-EPON station-side apparatus. This optical transceiver is provided with an optical sub-assembly implemented by a single-core bidirectional 3-port Bi-D (Bi-Directional optical module).

The optical sub-assembly includes a TOSA (Transmitter Optical sub-Assembly) for 10G, a TOSA for 1G, and a ROSA (Receiver Optical sub-Assembly) that corresponds to both 10G/1G.

The TOSA for 1G is included in the 10G-EPON optical transceiver so that, when 10G-EPON is introduced by installing a 10G-EPON station-side apparatus in place of an EPON station-side apparatus, service is also continuously provided to existing home-side apparatuses that have downlink transmission rate of 1G.

CITATION LIST

Patent Literature

PATENT LITERATURE 1: Japanese Laid-Open Patent Publication No. 2014-109604

SUMMARY OF INVENTION (1) An optical transceiver according to one mode of the present disclosure includes: a first light emitting element configured to perform electric-optic conversion at a first transmission rate; a second light emitting element configured to perform electric-optic conversion at a second transmission rate higher than the first transmission rate; a light receiving element configured to perform optic-electric conversion at a predetermined transmission rate; an optical sub-assembly accommodating the light emitting elements and the light receiving element; a circuit board having a plurality of integrated circuits which are configured to drive the light emitting elements and the light receiving element; a housing accommodating the optical sub-assembly and the circuit board, the housing having a longest dimension in a longitudinal direction thereof and having thermal conductivity; a temperature sensor configured to detect a temperature inside the housing; a temperature control unit configured to determine a control value to be designated to the integrated circuit that corresponds at least one target element among the light emitting elements and the light receiving element, in accordance with a detection temperature detected by the temperature sensor; and a light emission control unit configured to set a light emission state of an apparatus to which the light emission control unit belongs, to any of states 1 to 3 below. The optical sub-assembly is disposed at one end side in the longitudinal direction with respect to a main heat generation member among the plurality of integrated circuits, and the temperature sensor is disposed at another end side in the longitudinal direction with respect to the heat generation member.

State 1: a state in which the first light emitting element is ON and the second light emitting element is OFF;

state 2: a state in which the first light emitting element is ON and the second light emitting element is ON; and state 3: a state in which the first light emitting element is OFF and the second light emitting element is ON.

(7) A method according to one mode of the present disclosure is a method for estimating a temperature of an optical transceiver, the optical transceiver including: a first light emitting element configured to perform electric-optic conversion at a first transmission rate; a second light emitting element configured to perform electric-optic conversion at a second transmission rate higher than the first transmission rate; and a light receiving element configured to perform optic-electric conversion at a predetermined transmission rate. The method includes: a first step of setting a light emission state of an apparatus to which the optical transceiver belongs, to any of the states 1 to 3; and a second step of estimating a steady temperature of a target element which is at least one of the light emitting elements and the light receiving element in the state 1 to 3, using as a reference a detection temperature detected by a temperature sensor provided to the optical transceiver.

The present disclosure can be realized not only as an optical transceiver or an optical communication apparatus provided with such characteristic processing units, but also as a program for causing a computer to perform such characteristic processing.

In addition, the present invention can be realized as a semiconductor integrated circuit that realizes part or all of the optical transceiver or the optical communication apparatus, or can be realized as a system that includes the optical transceiver or the optical communication apparatus.

BRIEF DESCRIPTION OF DRAWINGS

FIG. 9 is a diagram showing one example of a device control look-up table and a temperature correction look-up table.

DESCRIPTION OF EMBODIMENTS

Figure 1:
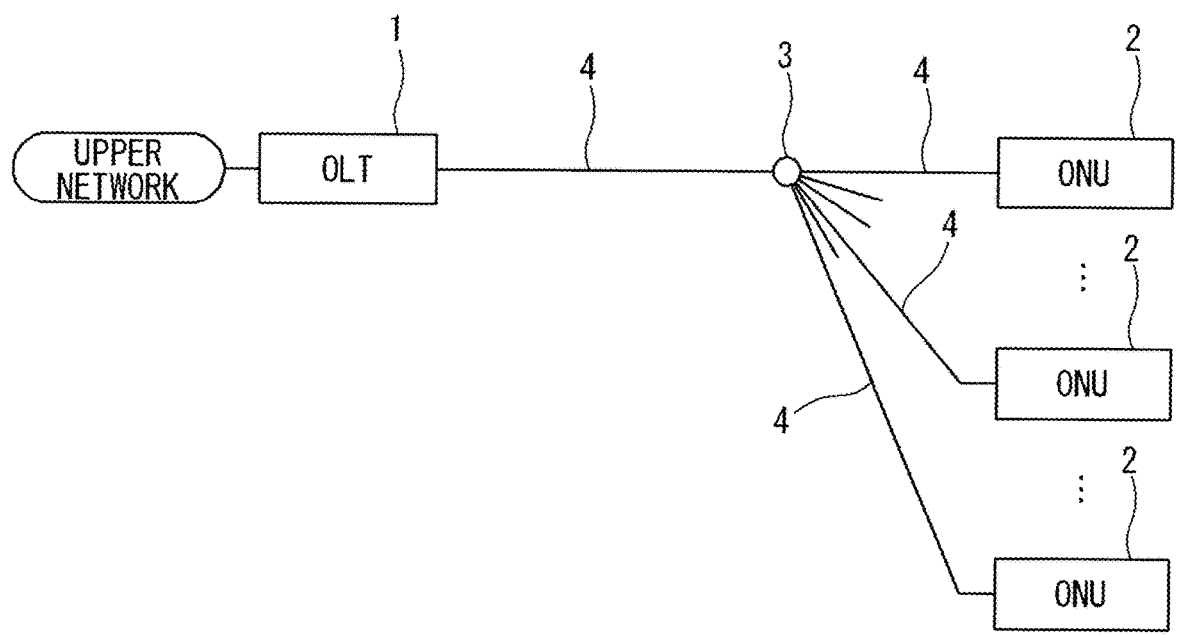
FIG. 1 is a schematic diagram of a PON system according to an embodiment of the present invention.

Problems to be Solved by the Disclosure

As described above, the optical transceiver mounted on a 10G-EPON station-side apparatus corresponds to two kinds of downlink transmission rates, i.e., 10G and 1G.

Therefore, if an operation method is employed in which: an optical transmitter for 10G is stopped in a case where there are only home-side apparatuses having a 1G downlink transmission rate at the time of introduction of 10G-EPON; or an optical transmitter for 1G is stopped at the time point of completion of switching to home-side apparatuses having a 10G downlink transmission rate, it is preferable because power consumption of the station-side apparatus can be reduced.

However, since the driver for an optical transmission unit has relatively large power consumption, the temperature distribution inside the housing of the optical transceiver could change in association with change in the light emission state, and the detection temperature detected by a temperature sensor mounted to a microcomputer could diverge from the temperatures of optical devices such as a light emitting element and a light receiving element.

Therefore, if a control value that corresponds to the detection temperature detected by the temperature sensor is designated to the driver for the optical device irrespective of change in the ON/OFF state of light emission, there is a risk that the accuracy of control on the optical device is decreased.

As a solution to this, it is conceivable that temperature sensors that individually detect the temperatures of target elements such as a light emitting element and a light receiving element are provided in an optical sub-assembly, and a control value is determined on the basis of the detection temperature detected by a corresponding temperature sensor.

However, individual provision of temperature sensors for the respective target elements leads to a new problem that: the number of components of the optical transceiver increases; the production cost increases; and the optical sub-assembly is enlarged.

In consideration of such conventional problems, an object of the present disclosure is to provide an optical transceiver and the like that can, without further providing temperature sensors individually, prevent decrease of control accuracy associated with switching performed between light emission states of light emitting elements having different transmission rates.

Effects of the Present Disclosure

According to the present disclosure, it is possible to prevent decrease of control accuracy associated with switching performed between light emission states of light emitting elements having different transmission rates, without further providing temperature sensors individually.

Outline of Embodiment of the Present Disclosure

Hereinafter, the outlines of an embodiment of the present disclosure are listed and described.

(1) An optical transceiver of the present embodiment includes: a first light emitting element configured to perform electric-optic conversion at a first transmission rate; a second light emitting element configured to perform electric-optic conversion at a second transmission rate higher than the first transmission rate; a light receiving element configured to perform optic-electric conversion at a predetermined transmission rate; an optical sub-assembly accommodating the light emitting elements and the light receiving element; a circuit board having a plurality of integrated circuits which are configured to drive the light emitting elements and the light receiving element; a housing accommodating the optical sub-assembly and the circuit board, the housing having a longest dimension in a longitudinal direction thereof and having thermal conductivity; a temperature sensor configured to detect a temperature inside the housing; a temperature control unit configured to determine a control value to be designated to the integrated circuit that corresponds at least one target element among the light emitting elements and the light receiving element, in accordance with a detection temperature detected by the temperature sensor, and a light emission control unit configured to set a light emission state of an apparatus to which the light emission control unit belongs, to any of states 1 to 3 below. The optical sub-assembly is disposed at one end side in the longitudinal direction with respect to a main heat generation member among the plurality of integrated circuits, and the temperature sensor is disposed at another end side in the longitudinal direction with respect to the heat generation member.

State 1: a state in which the first light emitting element is ON and the second light emitting element is OFF;

state 2: a state in which the first light emitting element is ON and the second light emitting element is ON; and state 3: a state in which the first light emitting element is OFF and the second light emitting element is ON.

According to the optical transceiver of the present embodiment, the optical sub-assembly is disposed at one end side in the longitudinal direction with respect to the main heat generation member among the plurality of integrated circuits, and the temperature sensor is disposed at the other end side in the longitudinal direction with respect to the heat generation member. Thus, a state is established in which a part of the optical sub-assembly and the temperature sensor are separated from the heat generation member at substantially the same level in terms of heat, in the longitudinal direction of the housing.

Accordingly, even if a control value that corresponds to the detection temperature detected by the temperature sensor is employed without modification, the driver for the optical device (for example, light receiving element) accommodated in a part of the optical sub-assembly can be appropriately controlled.

Therefore, without further providing temperature sensors individually, it is possible to prevent decrease of control accuracy associated with switching performed among light emission states of light emitting elements having different transmission rates.

(2) In the optical transceiver of the present embodiment, preferably, the temperature control unit estimates a steady temperature of the target element in the state 1 to 3, using the detection temperature detected by the temperature sensor as a reference.

Accordingly, even when the detection temperature detected by the temperature sensor cannot be used without modification although the above-described layout is employed, a substantially accurate control value can be determined by use of the estimation value of the steady temperature of the target element.

(3) In the optical transceiver of the present embodiment, preferably, the temperature control unit estimates a temperature change of the target element associated with switching performed among the states 1 to 3, using the detection temperature detected by the temperature sensor as a reference.

Accordingly, the temperature change (transient state) of the target element associated with the switching is estimated, and thus, the accuracy of control in the transient state can be improved when compared with a case where a control value is obtained only on the basis of a steady temperature.

(4) In the optical transceiver of the present embodiment, preferably, the second light emitting element is accommodated in a portion that is closest to the heat generation member, among portions that form the optical sub-assembly, and a TEC configured to keep a temperature of the second light emitting element is accommodated in the closest portion.

In this case, since the TEC keeps the temperature of the second light emitting element, the second light emitting element can be excluded from the targets of control performed by the temperature control unit.

(5) When the optical transceiver of the present embodiment further includes a TEC configured to keep the temperature of the second light emitting element, it is preferable that the light emission control unit causes ON/OFF of the TEC and ON/OFF of the second light emitting element to be performed in conjunction with each other.

Accordingly, in state 1, not only the driver for the second light emitting element stops but also TEC and the control unit therefor stop, and thus, power consumption in state 1 can be further reduced.

(6) When the optical transceiver of the present embodiment further includes a TEC configured to keep the temperature of the second light emitting element, the light emission control unit may set the TEC to be ON, irrespective of ON/OFF of the second light emitting element.

Figure 7:
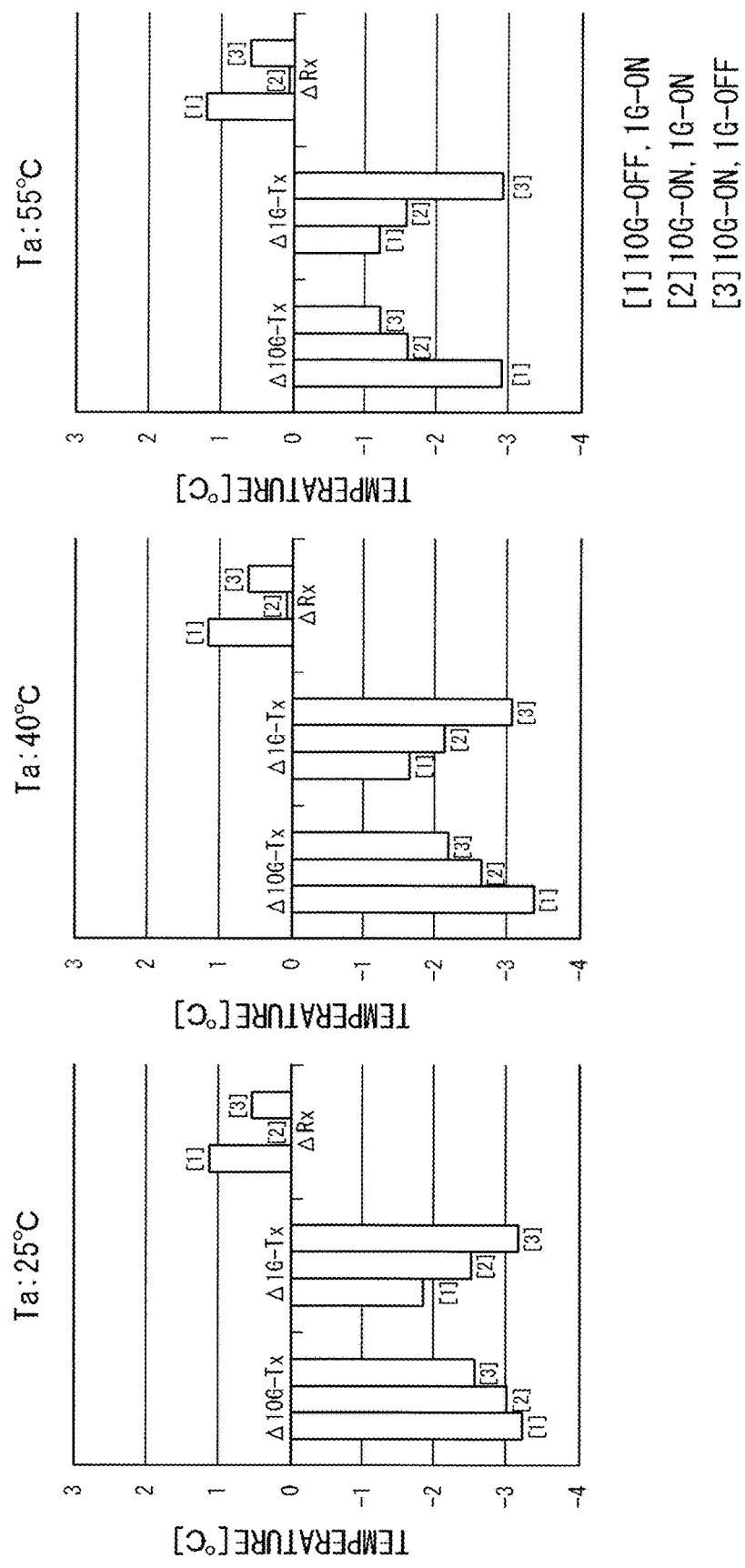
FIG. 7 shows bar graphs indicating a temperature measurement result 1.

Accordingly, divergence between the detection temperature detected by the temperature sensor and the temperature of the target element falls within a predetermined range, and thus, the possibility that the detection temperature detected by the temperature sensor can be used without correction can be increased (see "ΔRx" in the temperature measurement result 1 shown in FIG. 7).

(7) A temperature estimation method of the present embodiment is a method for estimating a temperature of an optical transceiver, the optical transceiver including: a first light emitting element configured to perform electric-optic conversion at a first transmission rate; a second light emitting element configured to perform electric-optic conversion at a second transmission rate higher than the first transmission rate; and a light receiving element configured to perform optic-electric conversion at a predetermined transmission rate. The method includes: a first step of setting a light emission state of an apparatus to which the optical transceiver belongs, to any of states 1 to 3 below; and a second step of estimating a steady temperature of a target element which is at least one of the light emitting elements and the light receiving element in the state 1 to 3, using as a reference a detection temperature detected by a temperature sensor provided to the optical transceiver.

State 1: a state in which the first light emitting element is ON and the second light emitting element is OFF;

state 2: a state in which the first light emitting element is ON and the second light emitting element is ON; and state 3: a state in which the first light emitting element is OFF and the second light emitting element is ON.

According to the temperature estimation method of the present embodiment, the steady temperature of the target element in state 1 to 3 is estimated. Thus, even when the detection temperature detected by the temperature sensor cannot be used without modification, a substantially accurate control value can be determined by use of the estimation value of the steady temperature of the target element.

Thus, without further providing temperature sensors individually, it is possible to prevent decrease of the control accuracy associated with switching performed among the light emission states of light emitting elements having different transmission rates.

(8) Preferably, the temperature estimation method of the present embodiment further includes a third step of estimating a temperature change of the target element associated with switching performed among the states 1 to 3, using the detection temperature detected by the temperature sensor as a reference.

Accordingly, the temperature change (transient state) of the target element associated with switching is estimated, and thus, the accuracy of control in the transient state can be improved when compared with a case where a control value is obtained only on the basis of a steady temperature.

Details of Embodiments of the Present Disclosure

Hereinafter, details of embodiments of the present disclosure will be described with reference to the drawings. It should be noted that at least some parts of the embodiments described below may be combined as desired.

[Overall Configuration of PON System]

FIG. 1 is a schematic diagram of a PON system according to an embodiment of the present disclosure.

As shown in FIG. 1, a PON system of the present embodiment includes: a station-side apparatus (OLT) 1 connected to an upper network; a plurality of home-side apparatuses (ONU) 2 connected to a local network (not shown); and a splitter 3 which is a passive optical branching node. The PON system shown in FIG. 1 is implemented by a 10G-EPON, for example.

The station-side apparatus 1 is connected to the splitter 3 by a single-core bidirectional optical fiber 4. Each home-side apparatus 2 is connected to the splitter 3 by the single-core bidirectional optical fiber 4 branched from the splitter 3.

In the 10G-EPON, in order to ensure compatibility with conventional (1G) EPON home-side apparatuses 2, downlink optical signals of two kinds of transmission rates are multiplexed at different wavelengths. Specifically, the transmission rates and wavelengths of 1G and 10G downlink optical signals are as follows.

1G downlink optical signal: transmission rate=1.25 Gbps, wavelength=1490 nm 10G downlink optical signal: transmission rate=10.3125 Gbps, wavelength=1577 nm Therefore, the station-side apparatus 1 of the present embodiment includes an optical transmitter for 1G and an optical transmitter for 10G that can send out the respective downlink optical signals described above.

In the 10G-EPON, the 1G uplink optical signal is an optical signal having a wavelength of 1310 nm, the 10G uplink optical signal is an optical signal having a wavelength of 1270 nm, and the 1G uplink optical signal and the 10G uplink optical, signal are each time-division multiplexed.

[Internal Configuration of Station-Side Apparatus]

Figure 2:
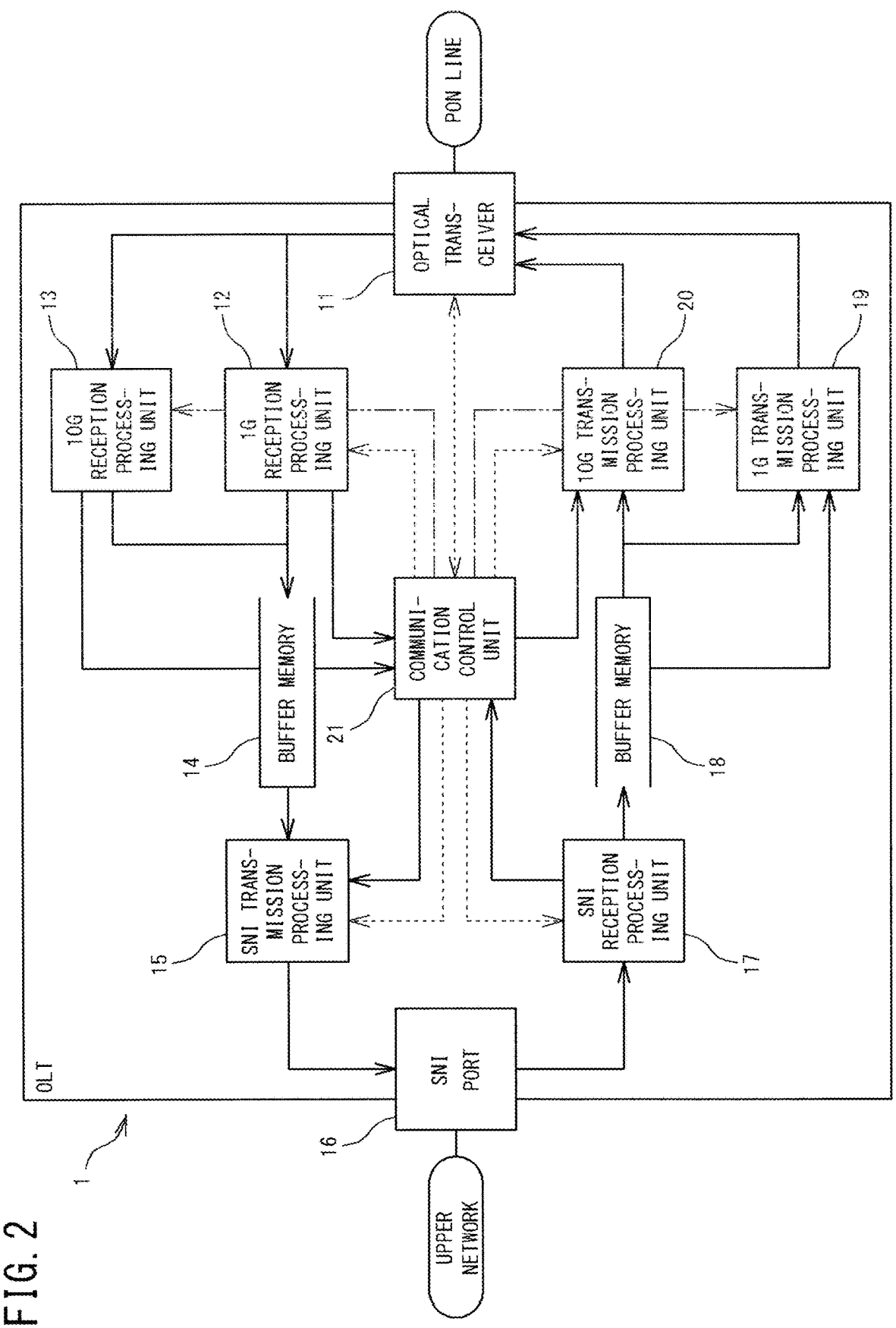
FIG. 2 is a block diagram showing an internal configuration of a station-side apparatus.

FIG. 2 is a block diagram showing one example of an internal configuration of the station-side apparatus 1.

As shown in FIG. 2, the station-side apparatus 1 includes an optical transceiver 11, a 1G reception processing unit 12, a 10G reception processing unit 13, a buffer memory 14, an SNI (Service Node Interface) transmission processing unit 15, an SNI port 16, an SNI reception processing unit 17, a buffer memory 18, a 1G transmission processing unit 19, a 10G transmission processing unit 20, and a communication control unit 21.

The optical transceiver 11 is implemented as a pluggable optical transceiver. Therefore, the optical transceiver 11 can be attached to/detached from the station-side apparatus 1 by being inserted into/pulled out of a cage provided to a circuit board of the station-side apparatus 1.

The optical transceiver 11 receives a downlink optical signal transmitted by each home-side apparatus 2 and converts the received optical signal into an electric signal. The optical transceiver 11 sends the converted electric signal to each of the 1G reception processing unit 12 and the 10G reception processing unit 13.

The 1G reception processing unit 12 extracts a 1G electric signal from the electric signal received from the optical transceiver 11, and reconstitute a communication frame from the extracted electric signal.

In accordance with the kind of the communication frame, the 1G reception processing unit 12 distributes the communication frame to the communication control unit 21 or the SNI transmission processing unit 15. Specifically, the 1G reception processing unit 12 outputs a data frame to the SNI transmission processing unit 15 via the buffer memory 14, and outputs a control frame to the communication control unit 21.

The 10G reception processing unit 13 extracts a 10G electric signal from the electric signal received from the optical transceiver 11, and reconstitutes a communication frame from the extracted electric signal.

In accordance with the kind of the communication frame, the 10G reception processing unit 13 distributes the communication frame to the communication control unit 21 or the SNI transmission processing unit 15. Specifically, the 10G reception processing unit 13 outputs a data frame to the SNI transmission processing unit 15 via the buffer memory 14, and outputs a control frame to the communication control unit 21.

The SNI transmission processing unit 15 transmits the control frame from the communication control unit 21 and the data frame from the reception processing unit 12, 13 at the PON side, to the upper network via the SNI port 16.

The SNI reception processing unit 17 outputs the data frame received from the upper network via the SNI port 16, to the buffer memory 18, and outputs the control frame received from the upper network via the SNI port 16, to the communication control unit 21.

The communication control unit 21 controls communication between the apparatus to which the communication control unit 21 belongs and a communication apparatus included in the upper network, in accordance with a predetermined communication protocol used in the upper network.

In accordance with the communication protocol above, the communication control unit 21 performs control and the like of operations of the SNI transmission processing unit 15 and the SNI reception processing unit 17.

In accordance with communication protocols such as an MPCP (Multi-Point Control Protocol) and an OAM (Operations, Administration, and Maintenance), the communication control unit 21 performs communication control, management, and the like with respect to each subordinate home-side apparatus 2 included in the PON line.

For example, the communication control unit 21 performs registration and opt-out of home-side apparatuses 2, uplink multi-access control in the PON line, and the like, on the basis of MPCP messages communicated with home-side apparatuses 2. In addition, the communication control unit 21 performs maintenance, management, and the like of home-side apparatuses 2 on the basis of OAM messages communicated with home-side apparatuses 2.

The communication control unit 21 generates control frames including various kinds of control information according to MPCP, OAM, and the like, and outputs the control frames to the 1G transmission processing unit 19 and the 10G transmission processing unit 20.

When a control frame is to be transmitted at 1G, the communication control unit 21 sends the control frame to the 1G transmission processing unit 19. When a data frame included in the buffer memory 18 is to be transmitted at 1G, the communication control unit 21 controls the 1G transmission processing unit 19 such that the transmission processing of the data frame is started at a predetermined transmission timing.

When a control frame is to be transmitted at 10G, the communication control unit 21 sends the control frame to the 10G transmission processing unit 20. When a data frame included in the buffer memory 18 is to be transmitted at 10G, the communication control unit 21 controls the 10G transmission processing unit 20 such that the transmission process of the data frame is started at a predetermined transmission timing.

The 1G transmission processing unit 19 outputs the data frame received from the buffer memory 18 and the control frame received from the communication control unit 21, to the optical transceiver 11.

The 10G transmission processing unit 20 outputs the data frame received from the buffer memory 18 and the control frame received from the communication control unit 21, to the optical transceiver 11.

The optical transceiver 11 converts the data frame and the control frame which are electric signals (transmission data) received from the 1G transmission processing unit 19 and the 10G transmission processing unit 20, into optical signals, and transmits the optical signals to subordinate home-side apparatuses 2 included in the PON line.

[Circuit Configuration of Optical Transceiver]

Figure 3:
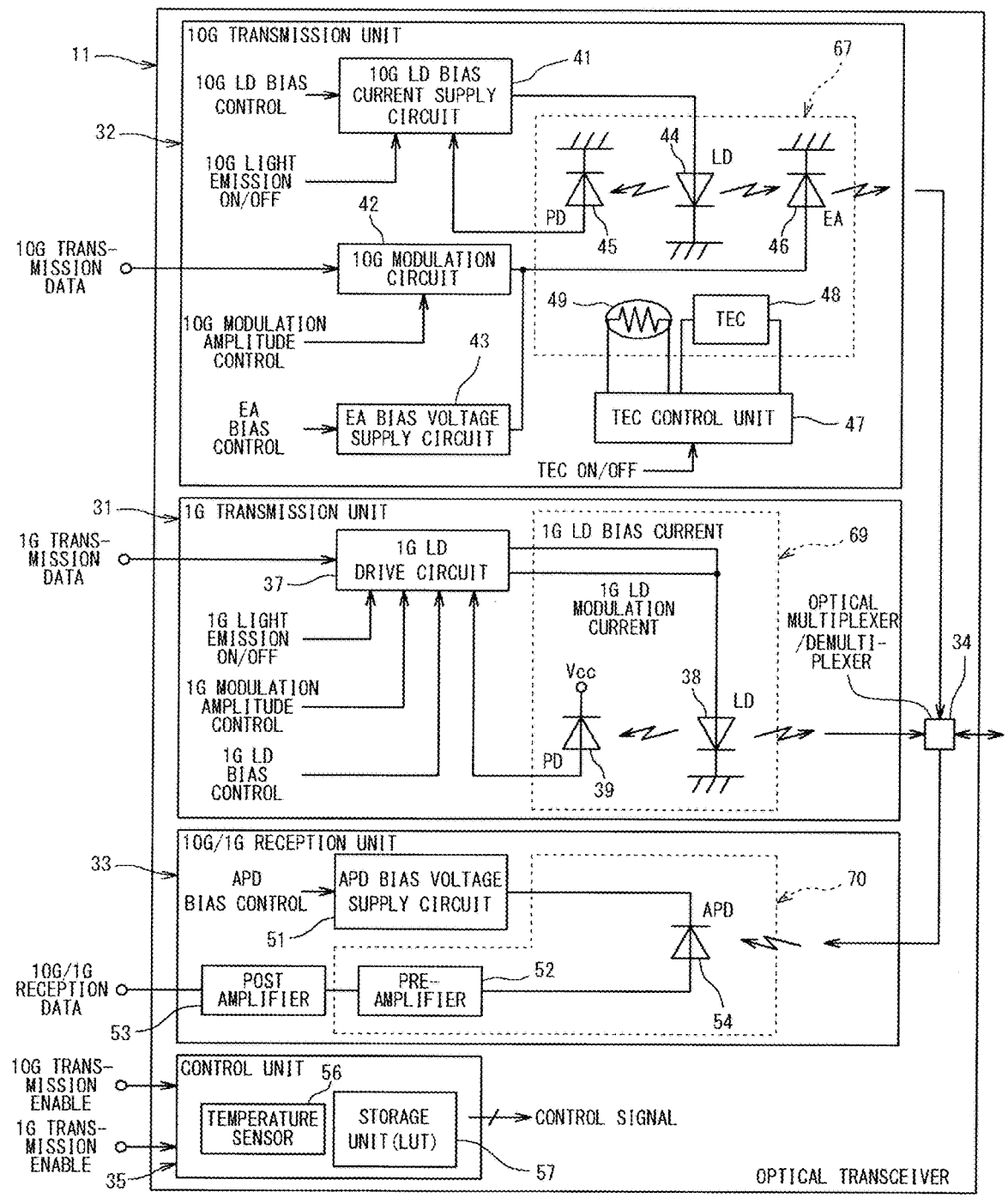
FIG. 3 is a block diagram showing one example of a circuit configuration of an optical transceiver.

FIG. 3 is a block diagram showing one example of a circuit configuration of the optical transceiver 11.

As shown in FIG. 3, the optical transceiver 11 of the present embodiment includes: a 1G transmission unit 31 which is an optical transmitter for 1G; a 10G transmission unit 32 which is an optical transmitter for 10G; a 10G/1G reception unit 33 which is an optical receiver that corresponds to both of 10G/1G; an optical multiplexer/demultiplexer 34 which separates an optical signal in accordance with a propagation direction; and a control unit 35 which controls integrated circuits and the like of units.

The 1G transmission unit 31 includes a 1G LD drive circuit 37, a light emitting element 38 implemented as a laser diode, and a monitor PD 39.

The 1G LD drive circuit 37 supplies, to the light emitting element 38, a bias current (LD current) based on a 1G LD bias control value designated from the control unit 35.

On the basis of light reception intensity of the monitor PD 39, the 1G LD drive circuit 37 performs fine adjustment (feedback control) on the LD current such that the amount of light emitted from the light emitting element 38 becomes constant.

The 1G LD drive circuit 37 supplies, to the light emitting element 38, 1G transmission data inputted from the 1G transmission processing unit 19 (FIG. 2) and a 1G modulation current based on a 1G modulation amplitude control value designated from the control unit 35.

The 10G transmission unit 32 includes a 10G LD bias current supply circuit 41, a 10G modulation circuit 42, an EA (Electro Absorption) bias voltage supply circuit 43, a light emitting element 44 implemented as a laser diode; a monitor PD 45; an EA modulator 46; a TEC control unit 47; a Peltier element (TEC: ThermoElectric Cooling module) 48; and a thermistor 49.

The 10G LD bias current supply circuit 41 supplies, to the light emitting element 44, a bias current (LD current) based on a 10G LD bias control value designated from the control unit 35.

On the basis of the light reception intensity of the monitor PD 45, the 10G LD bias current supply circuit 41 performs fine adjustment (feedback control) on the LD current such that the amount of light emitted from the light emitting element 44 becomes constant.

The 10G modulation circuit 42 supplies, to the EA modulator 46, a 10G modulation current based on 10G transmission data inputted from the 10G transmission processing unit 20 (FIG. 2) and a 10G modulation amplitude control value designated from the control unit 35.

The EA bias voltage supply circuit 43 supplies, to the EA modulator 46, a bias voltage based on an EA bias control signal designated from the control unit 35.

On the basis of the voltage value of the thermistor 49 which fluctuates according to the temperature, the TEC control unit 47 controls a DC current that is supplied to the Peltier element 48.

The cooling targets of the Peltier element 48 are the light emitting element 44, the monitor PD 45, and the EA modulator 46 of the 10G transmission unit 32. Thus, the Peltier element 48 and the thermistor 49 are accommodated, together with the light emitting element 44, the monitor PD 45, and the EA modulator 46, in a box-shaped package 67 (see FIG. 4 and FIG. 5) of an optical sub-assembly 65.

The 10G/1G reception unit 33 includes an APD bias voltage supply circuit 51, a preamplifier 52, a post amplifier 53, and a light receiving element 54. The light receiving element 54 is implemented as an avalanche photodiode, for example.

The APD bias voltage supply circuit 51 supplies, to the light receiving element 54, a bias voltage based on an APD bias control value designated from the control unit 35.

The light receiving element 54 converts an uplink optical signal supplied from the optical multiplexer/demultiplexer 34 into an electric signal (current) and outputs the electric signal to the preamplifier 52. The preamplifier 52 converts the supplied current into a voltage, and outputs the voltage to the post amplifier 53.

The post amplifier 53 binarizes the level of the voltage received from the preamplifier 52, and outputs the result, as 10G/1G reception data, to the reception processing unit 12, 13 (see FIG. 2) at the PON side.

The control unit 35 is implemented as a processor which performs logical operation processing, such as a CPU (Central Processing Unit), an MPU (Micro-Processing Unit), or an FPGA (Field-Programmable Gate Array), for example, and includes a temperature sensor 56 and a storage unit 57.

The control unit 35 sends out control signals to integrated circuits of drivers and the like for the light emitting elements 38, 44 and the light receiving element 54, thereby controlling the integrated circuits. The control signal sent out by the control unit 35 include the bias control values, the modulation amplitude control values, and the like described above.

The storage unit 57 stores a look-up table (LUT) having recorded therein control values such as a 1G modulation amplitude control value, a 1G LD bias control value, an APD bias control value set in advance for each detection temperature detected by the temperature sensor 56.

The control unit 35 reads out a control value that corresponds to the detection temperature detected by the temperature sensor 56 from the look-up table, and notifies the 1G LD drive circuit 37, the APD bias voltage supply circuit 51, and the like of the read out control value (feed forward control).

Thus, the control unit 35 has a function as a "temperature control unit" that determines a control value to be designated to an integrated circuit that corresponds to at least one target element of the light emitting element 38 and the light receiving element 54, in accordance with the detection temperature detected by the temperature sensor 56.

The control signals sent out by the control unit 35 also include ON/OFF signals for the 1G transmission unit 31 and the 10G transmission unit 32. Each ON/OFF signal is generated in accordance with an enable signal supplied from the station-side apparatus 1.

For example, when a 1G transmission enable signal is ON, the control unit 35 sends out a 1G light emission ON signal to the 1G LD drive circuit 37, and when the 1G transmission enable signal is OFF, the control unit 35 sends out a 1G light emission OFF signal to the 1G LD drive circuit 37.

Similarly, when a 10G transmission enable signal is ON, the control unit 35 sends out a 10G light emission ON signal to the 10G LD bias current supply circuit 41, and sends out a TEC ON signal to the TEC control unit 47. When the 10G transmission enable signal is OFF, the control unit 35 sends out a 10G light emission OFF signal to the 10G LD bias current supply circuit 41, and sends out a TEC OFF signal to the TEC control unit 47.

However, even when light emission in the 10G transmission unit 32 is stopped on the basis of the 10G light emission OFF signal, the ON state of the TEC control unit 47 may always be kept.

As described above, the control unit 35 has a function as a "light emission control unit" which sets the light emission state of the optical transceiver 11 included in the station-side apparatus 1 in operation (while service is being provided) to any of the three kinds below, by sending out light emission ON/OFF signals to the optical transmission units 31, 32.

State 1: 1G optical transmitter=ON/10G optical transmitter=OFF

State 2: 1G optical transmitter=ON/10G optical transmitter=ON

State 3: 1G optical transmitter=OFF/10G optical transmitter=ON

In a case where all of the home-side apparatuses 2 included in the PON line are those of 1G, or in a case where all of the home-side apparatuses 2 included in the PON line are those of 10G, if both of the 1G transmission unit 31 and the 10G transmission unit 32 mounted to the optical transceiver 11 are operated, power is wastefully consumed.

Thus, in the station-side apparatus 1 of the present embodiment, in accordance with the kind of the transmission rate of the home-side apparatuses 2 included in the PON line, either one of the optical transmission units 31 and 32 of the optical transceiver 11 can be set to OFF. In this case, the station-side apparatus 1 is operated as follows, for example.

In a case where, in place of an EPON station-side apparatus, the station-side apparatus 1 of the present embodiment is employed to introduce 10G-EPON, it is conceivable that there are only downlink 1G home-side apparatuses 2 at first. In this case, the optical transceiver 11 is operated in "state 1" in which only the 1G transmission unit 32 is ON.

Then, switching to downlink 10G home-side apparatuses 2 is advanced, and a state has been established in which downlink 1G home-side apparatuses 2 and downlink 10G home-side apparatuses 2 are both present, the optical transceiver 11 is operated in "state 2" in which both of the 1G transmission unit 31 and the 10G transmission unit 32 are ON.

When switching to downlink 10G home-side apparatuses 2 has been completed and all the home-side apparatuses included in the PON line are downlink 10G home-side apparatuses 2, the optical transceiver 11 is operated in "state 3" in which only the 10G transmitter is ON.

In this manner, in a case where the station-side apparatus 1 is continuously operated (while service is being provided), if the light emission state of the optical transceiver 11 is set in accordance with the kind of the downlink rate of the home-side apparatuses 2, power consumption can be suppressed when compared with a case where the 1G and 10G transmitters are set to be always ON.

In particular, the 10G transmission unit 32 which includes the EA modulator requires temperature control by use of the Peltier element 48, and has relatively large power consumption. Thus, in state 1, preferably, the light emitting element 44 and the TEC control unit 47 are simultaneously set to OFF.

An enable signal for switching the optical transceiver 11 to any one of states 1 to 3 is inputted from a communication terminal such as a PC connected to the station-side apparatus 1.

In FIG. 3, a broken line frame 67 in the 10G transmission unit 32 denotes the "box-shaped package" which is a component of the optical sub-assembly 65 described later (see FIG. 4 and FIG. 5). The circuit elements surrounded by the broken line frame 67 are accommodated in the box-shaped package of the optical sub-assembly 65.

A broken line frame 69 in the 1G transmission unit 31 denotes a "coaxial package" which is located at the rear end side (nearer to the box-shaped package) of the optical sub-assembly 65. The circuit elements surrounded by the broken line frame 69 are accommodated in the coaxial package at the rear end side of the optical sub-assembly 65.

A broken line frame 70 in the 10G/1G reception unit 33 denotes a "coaxial package" which is located at the front end side (farther from the box-shaped package) of the optical sub-assembly 65. The circuit elements surrounded by the broken line frame 70 are accommodated in the coaxial package at the front end side of the optical sub-assembly 65.

[Internal Structure of Optical Transceiver]

Figure 4:
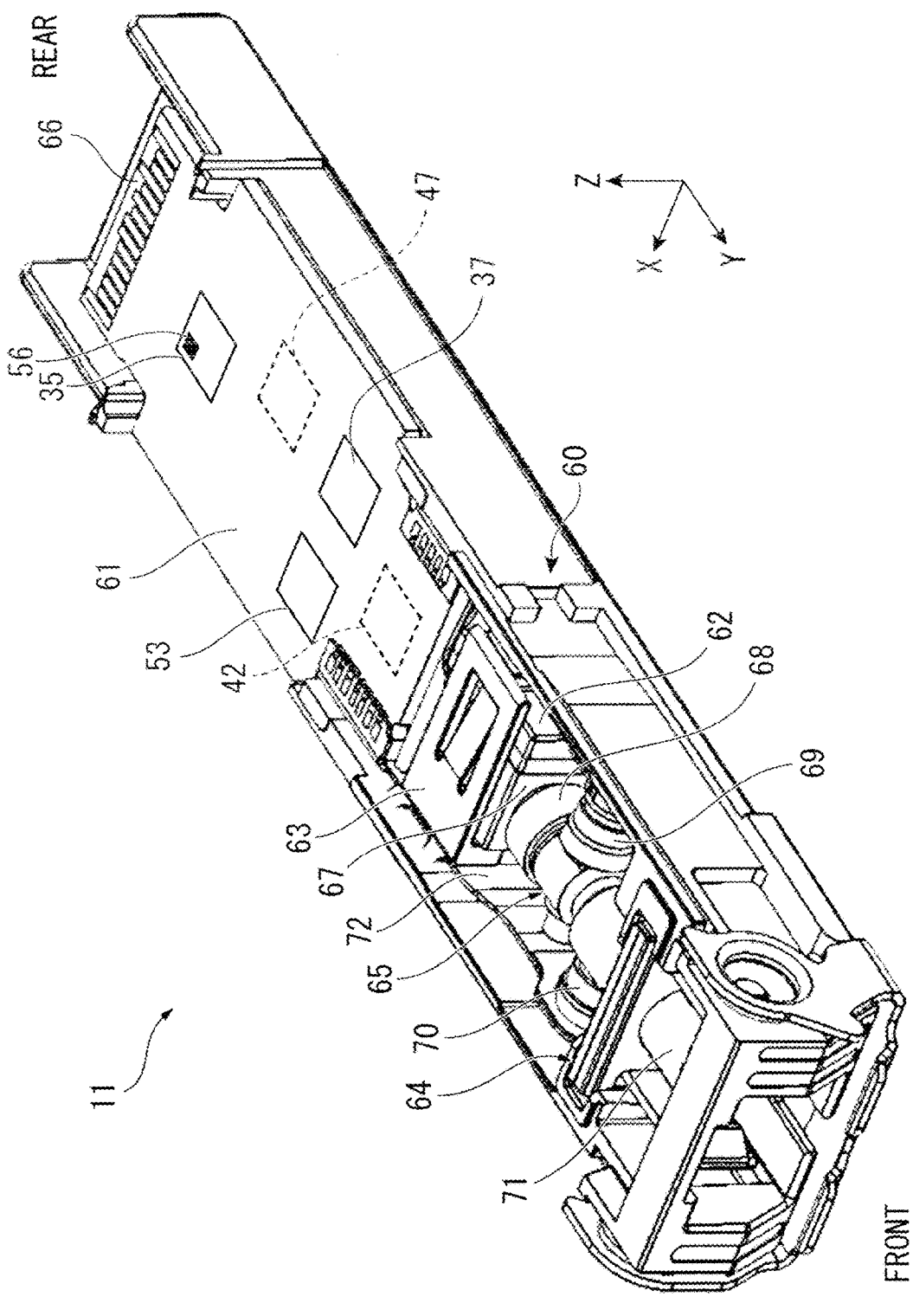
FIG. 4 is a perspective view showing one example of an internal structure of the optical transceiver.

FIG. 4 is a perspective view showing one example of an internal structure of the optical transceiver 11. Specifically, FIG. 4 is a perspective view of the optical transceiver 11 in a state where a lid member (not shown) which is a component of a housing 60 is removed.

Figure 5:
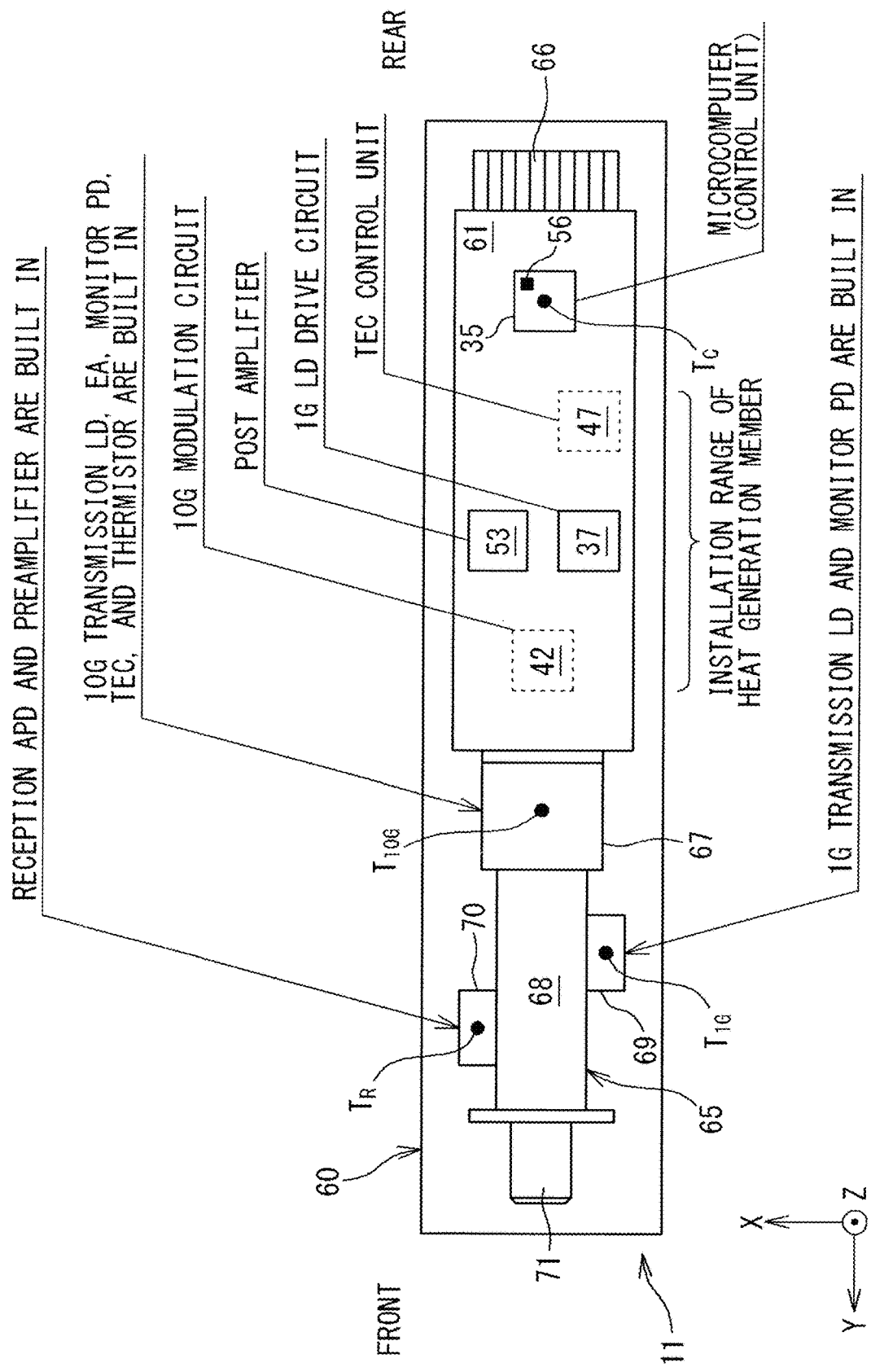
FIG. 5 is a schematic plan view showing one example of arrangement of components of the optical transceiver.

In the XYZ rectangular coordinate system shown in FIG. 4, the X direction, the Y direction, and the Z direction match the width direction, the longitudinal direction, and the thickness direction of the optical transceiver 11, respectively (the same applies to FIG. 5).

A circuit board 61, a thermal conduction member 62, a pressurization member 63, a holding member 64, the optical sub-assembly 65, and the like are accommodated in the housing 60.

The housing 60 is implemented as a metal component having a longest dimension in the longitudinal direction thereof and having thermal conductivity. Therefore, the housing 60 functions as a heat dissipation member that releases, to the outside, the heat generated from heat generation members (the 10G modulation circuit 42 and the like) accommodated in the housing. The circuit board 61 has a length that is substantially a half the length of the housing 60, and is disposed to the rear end side in the longitudinal direction (the Y direction) in the housing 60.

Electronic components such as integrated circuits for photoelectric conversion and signal processing are installed on the front surface and the back surface of the circuit board 61. An electric connector portion 66 is provided at the rear end edge of the circuit board 61.

The optical sub-assembly 65 is a so-called coaxial-type metal component, and is implemented as a single-core bidirectional 3-port Bi-D (Bi-Directional optical module). The optical sub-assembly 65 includes from the rear end side in the longitudinal direction (the Y direction) in order: the box-shaped package 67; a sleeve 68; the coaxial package 69; the coaxial package 70; and a receptacle portion 71.

The box-shaped package 67 has a substantially rectangular parallelepiped shape and accommodates the light emitting element 44 of 10G and the like. The coaxial package 69 has a substantially cylindrical shape, and accommodates the light emitting element 38 of 1G and the like. The coaxial package 70 has a substantially cylindrical shape, and accommodates the light receiving element 54 and the like.

At end faces of the box-shaped package 67 and the coaxial packages 69, 70, a plurality of lead pins (not shown) are provided so as to protrude therefrom. These lead pins are electrically connected to the circuit board 61 through a flexible printed circuit board 72.

The sleeve 68 is a cylindrical member that extends forward from the front end face of the box-shaped package 67 in the longitudinal direction (the Y direction). The axis of the sleeve 68 matches the optical axis direction of the optical sub-assembly 65. The receptacle portion 71 extending further to the front end side is mounted to the front end of the sleeve 68.

The coaxial package 69 at the rear end side protrudes from the outer peripheral surface of the sleeve 68 to one side in the width direction (the X direction). The coaxial package 70 at the front end side protrudes from the outer peripheral surface of the sleeve 68 to the other side in the width direction (the X direction).

[Arrangement of Components of Optical Transceiver]

FIG. 5 is a schematic plan view showing one example of arrangement of components of the optical transceiver 11.

As shown in FIG. 5, the optical sub-assembly 65 includes from the rear end side in the longitudinal direction (the Y direction) in order: the box-shaped package 67; the coaxial package 69; and the coaxial package 70. The box-shaped package 67 is located close to the front end edge of the circuit board 61.

The box-shaped package 67 accommodates the light emitting element 44 of 10G, the monitor PD 45, the EA modulator 46, the TEC 48, and the thermistor 49, which are components of the 10G transmission unit 32.

The coaxial package 69 accommodates the light emitting element 38 of 1G and the monitor PD 39, which are components of the 1G transmission unit 31.

The coaxial package 70 accommodates the light receiving element 54 and the preamplifier 52, which are components of the 10G/1G reception unit 33.

On the circuit board 61, from the rear end side in order, a control unit (hereinafter, also referred to as "microcomputer") 35 having the temperature sensor 56; the TEC control unit 47; the 1G LD drive circuit 37; the post amplifier 53; and the 10G modulation circuit 42 are disposed. These are each implemented as an integrated circuit.

Figure 6:
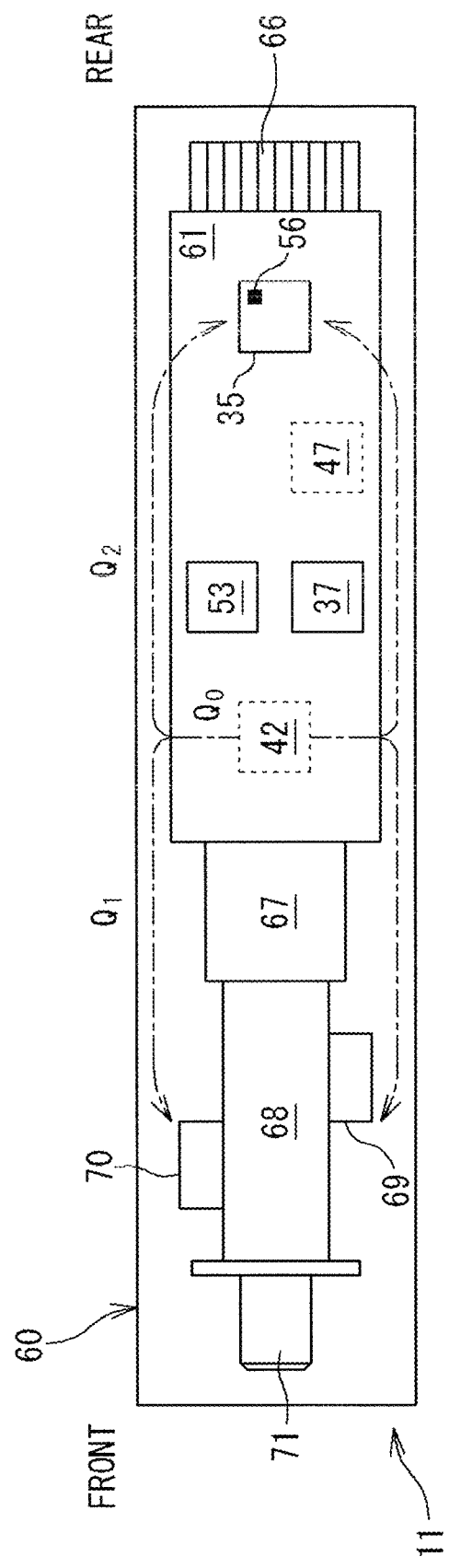
FIG. 6 is a schematic plan view showing one example of heat transfer routes from a heat generation member.

In FIG. 6, the integrated circuits that are indicated with solid lines are installed at the front surface side of the circuit board 61, and the integrated circuits that are indicated with broken lines are installed at the back surface side of the circuit board. The temperature sensor 56 of the microcomputer 35 is mounted to the microcomputer 35.

[Problem Associated with Switching of Light Emission State and Solution Thereof]

As described above, according to the optical transceiver 11 of the present embodiment, light emission of one of the two kinds of optical transmission units 31 and 32 can be stopped while provision of services is continued, and the light emission state of the apparatus to which the optical transceiver 11 belongs can be set to any of state 1 to state 3.

In this case, since the driver for each optical transmission unit 31, 32 has relatively large power consumption, the temperature distribution inside the housing 60 could change due to change in the ON/OFF state of light emission.

Therefore, if the temperature sensor 56 is disposed at an arbitrary position without taking into consideration the positional relationship among main heat generation members such as the 10G modulation circuit 42 and the 1G LD drive circuit 37, detection temperature detected by the temperature sensor 56 fails to accurately reflect the temperature of the optical device such as the light emitting element 38, 44 or the light receiving element 54, depending on the state, among state 1 to state 3, in which the station-side apparatus 1 is operated.

Accordingly, the control value read out from the look-up table is no longer a correct control value for the optical device, which could result in failure of appropriate control of the optical device.

As a solution for this, for example, it is conceivable that: temperature sensors are individually provided to the coaxial package 69 accommodating the light emitting element 38, the coaxial package 70 accommodating the light receiving element 54, and the like; and a control value is determined by use of the detection temperature detected by a corresponding temperature sensor.

However, individual provision of temperature sensors for the respective target elements has a drawback in that: the number of components of the optical transceiver 11 increases; the production cost increases; and the optical sub-assembly 65 is enlarged.

Therefore, in the present embodiment, the components inside the optical transceiver 11 are disposed such that the detection temperature detected by the temperature sensor 56 reflects the temperature of one or a plurality of optical devices even when any of states 1 to 3 is set.

Accordingly, the control value read out by the microcomputer 35 from the look-up table in accordance with the detection temperature detected by the temperature sensor 56 is prevented from diverging from the control value based on the actual temperature of the optical device.

Specifically, as shown in FIG. 5, the 10G modulation circuit 42, the 1G LD drive circuit 37, the post amplifier 53, the TEC control unit 47, and the like, which are main heat generation members, are disposed to the front end side of the circuit board 61, and the temperature sensor 56 of the microcomputer 35 is disposed to the rear end side with respect to the installation range of the main heat generation members.

Thus, the optical sub-assembly 65 is located to the front end side in the longitudinal direction with respect to the main heat generation members, and the temperature sensor 56 is located to the rear end side in the longitudinal direction with respect to the main heat generation members.

If such a layout is employed, as shown in FIG. 6, a state is established in which a part of the optical sub-assembly 65 and the temperature sensor 56 are separated from a heat generation member at substantially the same level in terms of heat, in the longitudinal direction (the Y direction).

For example, in FIG. 6, when generated heat Q0 from the 10G modulation circuit 42 is focused, the generated heat Q0 from this heat generation member is mainly transferred to the side wall of the housing 60, and is divided into transferred heat Q1 conducted to the front end side in the longitudinal direction (the Y direction), and transferred heat Q2 conducted to the rear end side.

In this case, the distance in the longitudinal direction (the Y direction) from the 10G modulation circuit 42 to the coaxial package 70 is substantially the same as the distance in the longitudinal direction from the 10G modulation circuit 42 to the temperature sensor 56, and thus, the heat quantity of the transferred heat Q1 that reaches the coaxial package 70 and the heat quantity of the transferred heat Q2 that reaches the temperature sensor 56 are substantially equal to each other.

Thus, for example, even when the heat quantity of the generated heat Q0 from the 10G modulation circuit 42 fluctuates due to ON/OFF switching of the 10G transmission unit 32, the heat quantity of the transferred heat Q1 and the heat quantity of the transferred heat Q2 also fluctuate in the same manner, and thus, it is considered that the temperature change of the coaxial package 70 and the temperature change of the temperature sensor 56 will be substantially at the same level.

Therefore, even when the light emission state is set to state 1 or state 2 by switching the ON/OFF of the 10G transmission unit 32, the detection temperature detected by the temperature sensor 56 substantially reflects the temperature of the coaxial package 70 of the optical sub-assembly 65.

Thus, even if a control value in the look-up table that corresponds to the detection temperature detected by the temperature sensor 56 is employed without modification, the integrated circuit that drives the optical device (specifically, the light receiving element 54) accommodated in the coaxial package 70 can be appropriately controlled.

However, with respect to a portion (for example, the coaxial package 69) having a distance from the heat generation member in the longitudinal direction (the Y direction) that is different from the distance from the heat generation member to the temperature sensor 56, there is a possibility that the heat quantity received from the heat generation member is not equal. Thus, the detection temperature detected by the temperature sensor 56 does not necessarily reflect the temperature of the portion of the optical sub-assembly 65.

Figure 8:
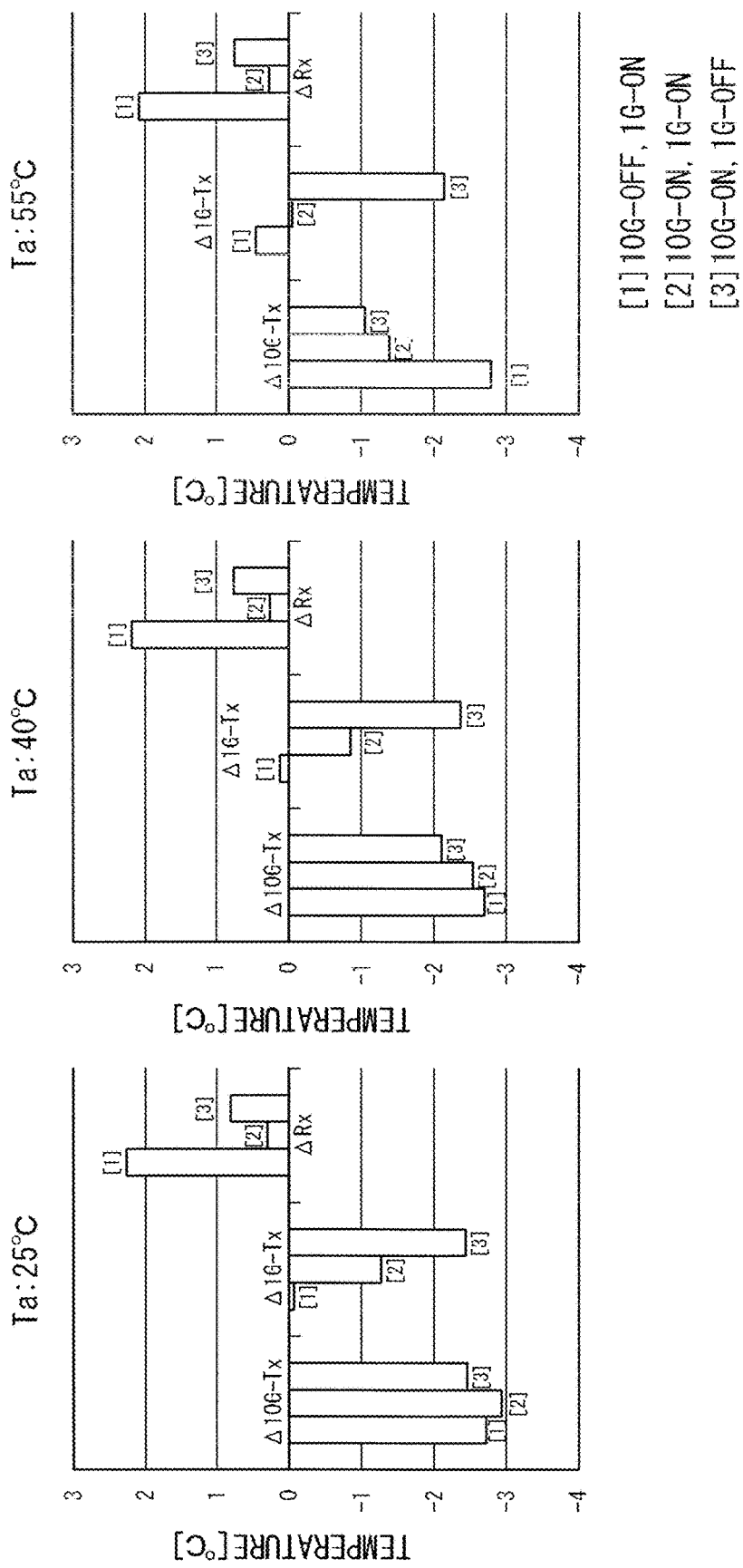
FIG. 8 shows bar graphs indicating a temperature measurement result 2.

Thus, the inventors of the present application verified, through a temperature measuring experiment, how much the temperature of a portion forming the optical sub-assembly 65 diverges from the detection temperature detected by the temperature sensor 56 in association with the change of states 1 to 3. The results of the experiment are shown in FIG. 7 and FIG. 8.

The installation points of the temperature sensor in the temperature measuring experiment are the position indicated by the dots shown in FIG. 5, and are the following four positions.

The position of the temperature sensor 56 of the microcomputer 35: measurement value is assumed to be "$T_C$".

The center portion of the box-shaped package 67: measurement value is assumed to be "$T_{10G}$".

The center portion of the coaxial package 69: measurement value is assumed to be "$T_{1G}$".

The center portion of the coaxial package 70: measurement value is assumed to be "$T_R$".

As shown in FIG. 7 and FIG. 8, "Δ10G-Tx", "Δ1G-Tx", and "ΔRx" respectively mean temperature differences defined by the following formulae.

$$\Delta 10G\text{-}Tx = T_{10G}\text{-}Tc = \text{temperature difference at box-shaped package 67 (10G-TOSA)}$$

$$\Delta 1G\text{-}Tx = T_{1G}\text{-}Tc = \text{temperature difference at coaxial package 69 (1G-TOSA)}$$

$$\Delta Rx = T_R\text{-}Tc = \text{temperature difference at coaxial package 70 (ROSA)}$$

Further, in FIG. 7 and FIG. 8, "Ta" is ambient temperature, the measurement value in each bar graph for each ambient temperature is a temperature difference in the "steady state" of state 1 to 3 (for example, the temperature at the time point when 10 minutes have elapsed after the light emission state had been switched).

[Temperature Measurement Result]

FIG. 7 is a graph showing a temperature measurement result 1. The temperature measurement result 1 is a measurement result obtained when temperature measurement was performed for each of states 1 to 3 in a condition that the TEC 48 was maintained to be always ON.

FIG. 8 is a graph showing a temperature measurement result 2. The temperature measurement result 2 is a measurement result obtained when temperature measurement was performed for each of states 1 to 3 in a condition that ON/OFF of the 10G transmission unit 32 and ON/OFF of the TEC 48 are performed in conjunction with each other.

Usually, the interval between temperatures that are recorded in a look-up table is set to be substantially 2° C. Therefore, if the temperature difference in all of states 1 to 3 is within 2° C., it is possible to consider that the detection temperature detected by the temperature sensor 56 reflects the temperature of the portion of interest of the optical sub-assembly 65.

From the aforementioned viewpoint, when ΔRx in the temperature measurement result 1 (TEC is always ON) shown in FIG. 7 is focused, the temperature difference in each of states 1 to 3 is less than 2° C. in all of the ambient temperature Ta of 25° C., 40° C., and 55° C.

The reason is considered as follows: since the coaxial package 70, which is ROSA, is farthest from the heat generation members (see FIG. 5) and is less likely to be influenced by heat generated from the heat generation members, the divergence from the detection temperature detected by the temperature sensor 56 does not become so large.

Therefore, it is considered that, with respect to the optical device (the light receiving element 54) of the 10G/1G reception unit 33 accommodated in the coaxial package 70, as long as a condition that the TEC 48 is maintained to be always ON is employed, it is possible, in any of states 1 to 3, to trust the detection temperature detected by the temperature sensor 56 without modification and employ a bias control value that corresponds to the detection temperature.

Next, when Δ1G-Tx in the temperature measurement result 1 (TEC is always ON) shown in FIG. 7 is focused, the temperature difference in state 2 (state 3 is not related because 1G is OFF) exceeds 2° C. in the ambient temperature Ta of 25° C. and 40° C.

Therefore, it is considered that, with respect to the optical device (the light emitting element 38) of the 1G transmission unit 31 accommodated in the coaxial package 69, even when a condition that the TEC 48 is maintained to be always ON is employed, the detection temperature detected by the temperature sensor 56 should be corrected and a control value that corresponds to the corrected temperature should be employed.

Next, when ΔRx in the temperature measurement result 2 (ON/OFF of 10G light emission and ON/OFF of TEC are performed in conjunction with each other) shown in FIG. 8 is focused, the temperature difference exceeds 2° C. in state 1 at ambient temperature Ta of 25° C.

Therefore, it is considered that, with respect to the optical device (the light receiving element 54) of the 10G/1G reception unit 33 accommodated in the coaxial package 70, when ON/OFF of 10G light emission and ON/OFF of the TEC 48 are performed in conjunction with each other, the detection temperature detected by the temperature sensor 56 should be corrected and a bias control value that corresponds to the corrected temperature should be employed.

Next, when Δ1G-Tx in the temperature measurement result 2 (ON/OFF of 10G light emission and ON/OFF of TEC are performed in conjunction with each other) shown in FIG. 8 is focused, the temperature difference in each of states 1 and 2 is less than 2° C. at the ambient temperature Ta of 25° C. and 40° C.

Therefore, it is considered that, with respect to the optical device (the light emitting element 38) of the 1G transmission unit 31 accommodated in the coaxial package 69, as long as a condition that ON/OFF of 10G light emission and ON/OFF of the TEC 48 are performed in conjunction with each other is employed, it is possible to trust the detection temperature detected by the temperature sensor 56 without modification and employ a control value that corresponds to the detection temperature.

[Device Temperature Estimation Method (Steady State)]

FIG. 9 is a diagram showing one example of a device control look-up table and a temperature correction look-up table.

As shown in the upper part of FIG. 9, the device control look-up table is in the form of an array in which device temperatures are arranged in the row direction, and kinds of control values are arranged in the column direction.

The kinds of control values include "1G modulation amplitude control value", "1G LD bias control value", and "APD bias control value".

Each data box of the device control look-up table has recorded therein a control value, according to the kind, that corresponds to a device temperature estimated from a detection temperature detected by the temperature sensor 56.

The device temperature is an estimation value calculated by adding a temperature correction value ΔT extracted from the temperature correction look-up table, to a monitor temperature at the current time point (Tmon: detection temperature detected by the temperature sensor 56).

As shown in the lower part of FIG. 9, the temperature correction look-up table is in the form of an array in which states 1 to 3 are arranged in the row direction and "Tx10G&TEC" (in the case of conjunction control), "Tx1G", "correction value $\Delta T_{Tx1G}$", and "correction value $\Delta T_{Rx}$" are arranged in the column direction.

When a temperature is estimated by use of the look-up tables shown in FIG. 9, the control unit 35 first determines which of states 1 to 3 corresponds to the light emission state at the current time point of the apparatus to which the control unit 35 belongs.

When the above determination result is, for example, "state 2", the control unit 35 reads out "$\Delta T_{Tx1G2}$" which is a 1G transmission correction value and "$\Delta T_{Rx2}$" which is a reception correction value, from the temperature correction look-up table.

Next, the control unit 35 employs, as a device temperature, a value obtained by adding the correction value read out from the temperature correction look-up table to the monitor temperature Tmon.

For example, when $\Delta T_{Tx1G2}$ is used as a correction value, the control unit 35 estimates the temperature value of Tmon+$\Delta T_{Tx1G2}$ as the device temperature (temperature of the light emitting element 38) of the 1G transmission unit 31.

Then, the control unit 35 reads out a control value that corresponds to the estimated temperature value, from the device control look-up table, and notifies a predetermined integrated circuit (the 1G LD drive circuit 37) of the read out control value.

[Example of Numerical Value of Temperature Correction Value]

Figure 10:
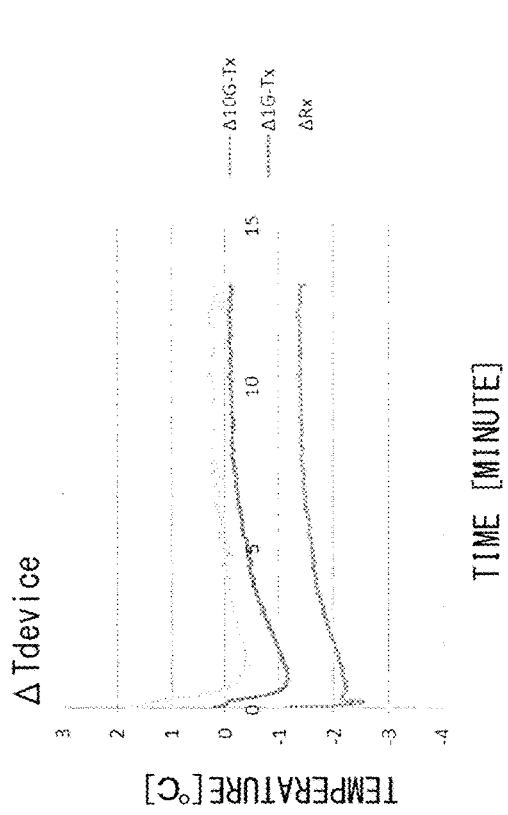
FIG. 10 shows a graph indicating the change in the temperature difference of each unit associated with the change in the light emission state, and an example of numerical values of the temperature correction look-up table created from this graph.

FIG. 10 shows a graph indicating the change in the temperature difference of each unit associated with the change in the light emission state, and an example of numerical values of the temperature correction look-up table created from this graph.

Specifically, the graph shown in the upper part of FIG. 10 is a graph that indicates actual measurement results of the temporal changes of Δ10G-Tx, Δ1GTx, and ΔR observed when the state of the optical transceiver 11 was changed from state 1 to state 2 in a case where the ambient temperature Ta was 55° C.

According to the graph shown in FIG. 10, at the time point t=0 when state 1 was the steady state, Δ1GTx=0.21° C. and ΔR=1.81° C. were observed.

In this case, in the temperature correction look-up table, "0.21° C." may be recorded as a fixed "correction value $T_{Tx1G1}$" in state 1, and "1.81° C." may be recorded as a fixed "correction value $T_{Rx1}$" in state 1.

Similarly, according to the graph shown in FIG. 10, at the time point t=600 s when state 2 was the steady state, Δ1GTx=−0.10° C. and ΔR=0.21° C. were observed.

In this case, in the temperature correction look-up table, "−0.10° C." may be recorded as a fixed "correction value $T_{Tx1G2}$" in state 2, and "0.21° C." may be recorded as a fixed "correction value $T_{Rx2}$" in state 2.

In this manner, if fixed correction values at the time when states 1 to 3 are the steady states are recorded in the temperature correction look-up table, it becomes possible to estimate a steady temperature of a target element at the time when state 1 to 3 is the steady state, by adding a correction value described in the table to the detection temperature (Tmon) detected by the temperature sensor 56.

[Device Temperature Estimation Method (Transient State)]

Figure 11:
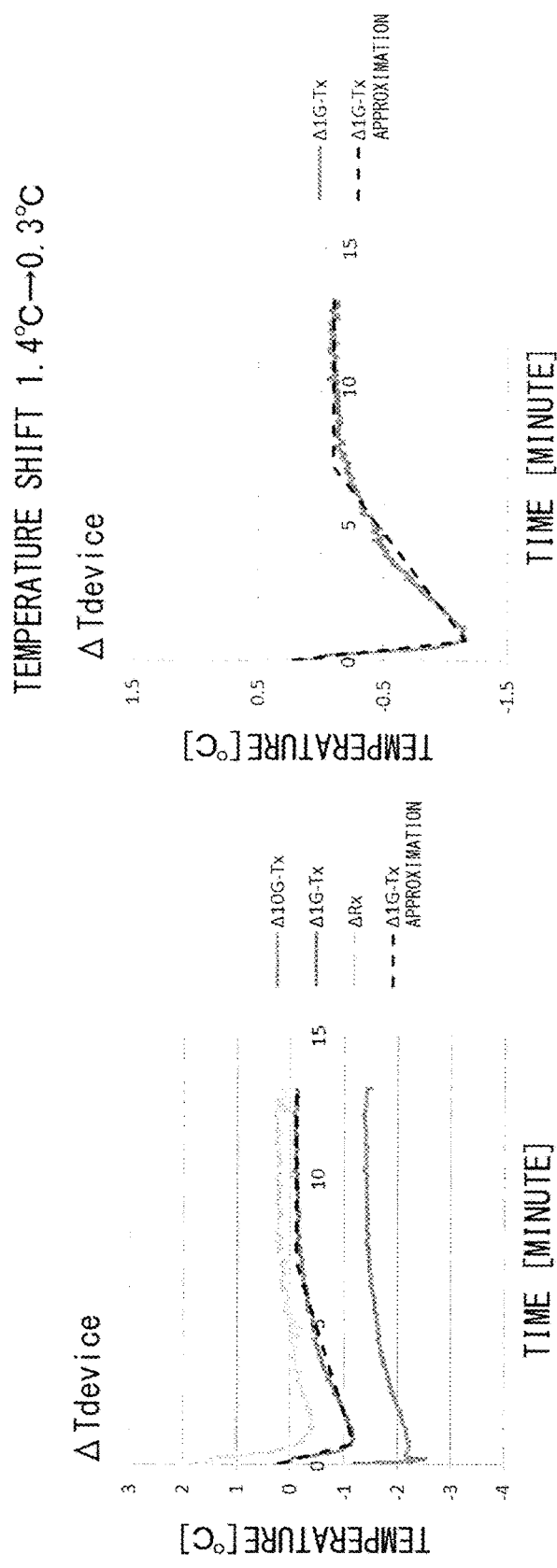
FIG. 11 shows graphs indicating the change in the temperature difference of each unit associated with the change in the light emission state, and one example of a transient state look-up table created from the graphs.

FIG. 11 shows graphs indicating the change in the temperature difference of each unit associated with the change in the light emission state, and one example of a transient state look-up table created from the graphs.

In FIG. 9 and FIG. 10, the temperature correction look-up table in which fixed temperature correction values are recorded is illustrated. However, for example, as shown in the graph in FIG. 10, in the time period from the switching time point (t=0), at which state 1 is switched to state 2, to about 5 minutes, Δ10G-Tx, Δ1GTx, and ΔR fluctuate to relatively large extents according to time.

Therefore, in the time period of a transient state in which the temperature temporally fluctuates, the fixed temperature correction value cannot be considered as an accurate temperature correction value, and has a drawback that the device temperature cannot be accurately estimated until a steady state is established.

Thus, it is preferable to employ a transient state look-up table which is based on a graph indicating the results obtained through actual measurement of the changes in Δ10G-Tx, Δ1GTx, and ΔR and which allows estimation of temperature change in a transient state which is associated with switching of the light emission state.

Here, a case is assumed in which, for example, a temporal change (transient response) of Δ1GTx is approximated as a linear function with respect to three time periods of t0 (=0)➔ t1 ➔ t2 ➔ .

Accordingly, the transient state look-up table is in the form of an array in which: switching directions among states 1 to 3 (in FIG. 1i, only one row of "state 1➔ 2" is shown) are arranged in in the row direction; and "t0" (switching time point), "t1", "t2", "ΔT0", "ΔT1", and "ΔT2" are arranged in the column direction.

ΔT0 is a temperature difference (initial value) at t0, ΔT1 is a temperature change amount in the time period of t0➔ t1 and t1➔ t2, and ΔT2 is a fixed value in the time period after t2.

For example, according to the graph at the right in FIG. 11 (temperature measurement result in a case of state 1➔ 2), Δ1G-Tx can be approximated such that: the initial value of the temperature at t=0 was 0.21° C.; the temperature decreased to −1.17° C. at t=42 seconds; and then, the temperature increased to −0.10° C. at t=420 seconds, whereby a steady state was established.

In this case, in the transient state look-up table, as data of state 1➔ 2, 0 seconds may be recorded for t0; 42 seconds may be recorded for t1; 420 seconds may be recorded for t2; 0.21° C. may be recorded for ΔT0; −1.17° C. may be recorded for ΔT1; and −0.10° C. may be recorded for ΔT2.

In this manner, by use of a transient state look-up table having recorded therein correction information that includes the times and the correction amounts and that approximates the temperature fluctuation in a transient state when the state is switched from state 1➔ 2, it becomes possible to estimate the temperature change of a target element in a transient state of state 1➔ 2, by adding a correction value for each time obtained from the correction information described in the table, to a detection temperature (Tmon) detected by the temperature sensor 56.

Figure 12:
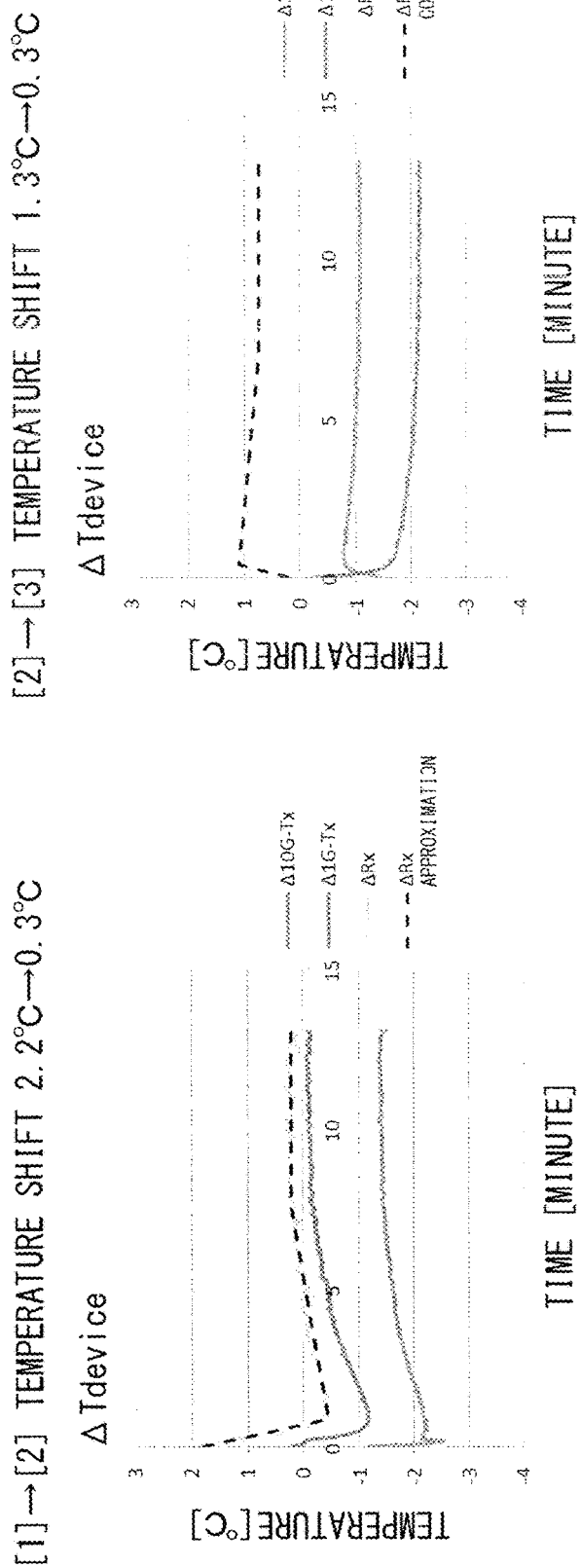
FIG. 12 shows graphs indicating the change in the temperature difference of each unit associated with the change in the light emission state, and another example of the transient state look-up table created from the graphs.

FIG. 12 shows graphs indicating the change in the temperature difference of each unit associated with the change in the light emission state, and another example of the transient state look-up table created from the graphs.

Here, a case is assumed in which, for example, a temporal change (transient response) of ΔRx is approximated as a linear function with respect to three time periods of t0(=0)➔t1➔t2➔.

For example, the graph at the left in FIG. 12 (temperature measurement result in a case of state 1➔2), ΔRx can be approximated such that: the initial value of the temperature at t=0 was 1.81° C.; the temperature decreased to −0.42° C. at t=52 seconds; and then, the temperature increased to −0.20° C. at t=450 seconds, whereby a steady state was established.

In this case, in the transient state look-up table, as data of state 1➔2, 0 seconds may be recorded for t0; 52 seconds may be recorded for t1; 450 seconds may be recorded for t2; 1.81° C. may be recorded for ΔT0; −0.42° C. may be recorded for ΔT1; and 0.21° C. may be recorded for ΔT2.

According to the graph at the right in FIG. 12 (temperature measurement result in a case of state 2➔3), ΔRx can be approximated such that: the initial value of the temperature at t=0 was 0.21° C.; the temperature increased to 1.1° C. at t=24 seconds; and then, the temperature decreased to 0.74° C. at t=420 seconds, whereby a steady state was established.

In this case, in the transient state look-up table, as data of state 2➔3, 0 seconds may be recorded for t0; 24 seconds may be recorded for t1; 420 seconds may be recorded for t2; 0.21° C. may be recorded for ΔT0; 1.1° C. may be recorded for ΔT1; and 0.74° C. may be recorded for ΔT2.

Other Modifications

The embodiment above is to be considered in all aspects as illustrative and not restrictive. The scope of the present disclosure is indicated by the appended claims rather than by the above description, and all changes which come within the meaning and range of equivalency of the claims are therefore intended to be embraced therein.

In the embodiment described above, the control unit 35 functions as a temperature control unit and a light emission control unit, but these functions may be performed by a different control unit.

In the embodiment described above, the temperature sensor 56 mounted to the control unit (microcomputer) 35 is used, but a temperature sensor that is not integrated with the microcomputer may be employed.

In the embodiment described above, the optical device of the 10G transmission unit 32 of which temperature is kept to be constant by the TEC 48 is excluded from the targets of temperature control performed by the control unit 35. However, instead of providing the TEC 48, the optical device of the 10G transmission unit 32 may be included in the targets of temperature control performed by the control unit 35.

In this case, the temperature of the optical device for 10G may be estimated using the detection temperature detected by the temperature sensor 56 as a reference, and a driver for the optical device for 10G may be operated in accordance with a control value determined from the estimated value.

In the embodiment described above, the optical transceiver 11 that includes the light emitting element 38 having a low transmission rate and the light emitting element 44 having a high transmission rate has been shown as an example. However, the optical transceiver 11 of the present embodiment may further include a "third light emitting element" which operates at another transmission rate.

As the third light emitting element, for example, a light emitting element that performs electric-optic conversion at a very low transmission rate for sending out an optical signal for management or control of the home-side apparatus 2, a light emitting element that performs electric-optic conversion for delivery of a video having an analog base signal, and the like are conceivable.

REFERENCE SIGNS LIST 1 station-side apparatus (OLT)
2 home-side apparatus (ONU)
3 splitter
4 optical fiber
11 optical transceiver
12 1G reception processing unit
13 10G reception processing unit
14 buffer memory
15 SNI transmission processing unit
16 SNI port
17 SNI reception processing unit
18 buffer memory
19 1G transmission processing unit
20 1G transmission processing unit
21 communication control unit
31 1G transmission unit (optical transmitter)
32 10G transmission unit (optical transmitter)
33 10G/1G reception unit
34 optical multiplexer/demultiplexer
35 control unit (microcomputer, temperature control unit, light emission control unit)
37 1G LD drive circuit
38 light emitting element
39 monitor PD
41 10G LD bias current supply circuit
42 10G modulation circuit
43 EA bias voltage supply circuit
44 light emitting element
45 monitor PD
46 EA modulator
47 TEC control unit
48 thermistor
48 Peltier element (TEC)
49 thermistor
51 APD bias voltage supply circuit
52 preamplifier
53 post amplifier
54 light receiving element
56 temperature sensor
57 storage unit
60 housing
61 circuit board
62 thermal conduction member
63 pressurization member
64 holding member
65 optical sub-assembly
66 electric connector portion
67 box-shaped package
68 sleeve
69 coaxial package
70 coaxial package
71 receptacle portion
72 flexible printed circuit board

The invention claimed is:

1. An optical transceiver comprising:
a first light emitting element configured to perform electric-optic conversion at a first transmission rate;
a second light emitting element configured to perform electric-optic conversion at a second transmission rate higher than the first transmission rate;

a light receiving element configured to perform optic-electric conversion at a predetermined transmission rate;
an optical sub-assembly accommodating the light emitting elements and the light receiving element;
a circuit board having a plurality of integrated circuits which are configured to drive the light emitting elements and the light receiving element;
a housing accommodating the optical sub-assembly and the circuit board, the housing having a longest dimension in a longitudinal direction thereof and having thermal conductivity;
a temperature sensor configured to detect a temperature inside the housing;
a temperature control unit configured to determine plural types of control values to be designated to an integrated circuit that corresponds to the first light emitting element and the light receiving element, among the plurality of the integrated circuits, in accordance with a detection temperature detected by the temperature sensor; and
a light emission control unit configured to set a light emission state of an apparatus to which the light emission control unit belongs, to any of states 1 to 3 below, wherein
the optical sub-assembly is disposed at one end side in the longitudinal direction with respect to a main heat generation member among the plurality of integrated circuits, and the temperature sensor is disposed at another end side in the longitudinal direction with respect to the heat generation member, and
state 1: a state in which the first light emitting element is ON and the second light emitting element is OFF;
state 2: a state in which the first light emitting element is ON and the second light emitting element is ON; and
state 3: a state in which the first light emitting element is OFF and the second light emitting element is ON.

2. The optical transceiver according to claim 1, wherein the temperature control unit estimates a steady temperature of the first light emitting element and the light receiving element in the state 1 to 3, using the detection temperature detected by the temperature sensor as a reference.

3. The optical transceiver according to claim 1, wherein the temperature control unit estimates a temperature change of the first light emitting element and the light receiving element associated with switching performed among the states 1 to 3, using the detection temperature detected by the temperature sensor as a reference.

4. The optical transceiver according to claim 1, wherein the second light emitting element is accommodated in a portion that is located close to one end of the circuit board in the longitudinal direction, among portions that form the optical sub-assembly, and
a TEC configured to maintain a temperature of the second light emitting element is accommodated in the portion.

5. The optical transceiver according to claim 1, further comprising
a TEC configured to maintain a temperature of the second light emitting element, wherein
the light emission control unit causes ON/OFF of the TEC and ON/OFF of the second light emitting element to be performed in conjunction with each other.

6. The optical transceiver according to claim 1, further comprising
a TEC configured to maintain a temperature of the second light emitting element, wherein the light emission control unit sets the TEC to be ON, irrespective of ON/OFF of the second light emitting element.

7. A method for estimating a temperature of an optical transceiver,
the optical transceiver including:
a first light emitting element configured to perform electric-optic conversion at a first transmission rate;
a second light emitting element configured to perform electric-optic conversion at a second transmission rate higher than the first transmission rate; and
a light receiving element configured to perform optic-electric conversion at a predetermined transmission rate,
the method comprising:
a first step of setting a light emission state of an apparatus to which the optical transceiver belongs, to any of states 1 to 3 below; and
a second step of estimating a steady temperature of the first light emitting element and the light receiving element in the state 1 to 3, using as a reference a detection temperature detected by a temperature sensor provided to the optical transceiver, wherein
state 1: a state in which the first light emitting element is ON and the second light emitting element is OFF;
state 2: a state in which the first light emitting element is ON and the second light emitting element is ON; and
state 3: a state in which the first light emitting element is OFF and the second light emitting element is ON.

8. The method for estimating the temperature of the optical transceiver according to claim 7, further comprising a third step of estimating a temperature change of the first light emitting element and the light receiving element associated with switching performed among the states 1 to 3, using the detection temperature detected by the temperature sensor as a reference.

9. An optical transceiver comprising:
a first light emitting element configured to perform electric-optic conversion at a first transmission rate;
a second light emitting element configured to perform electric-optic conversion at a second transmission rate higher than the first transmission rate;
a light receiving element configured to perform optic-electric conversion at a predetermined transmission rate;
an optical sub-assembly accommodating the light emitting elements and the light receiving element;
a circuit board having a plurality of integrated circuits which are configured to drive the light emitting elements and the light receiving element;
a housing accommodating the optical sub-assembly and the circuit board, the housing having a longest dimension in a longitudinal direction thereof and having thermal conductivity;
a temperature sensor configured to detect a temperature inside the housing;
a temperature control unit configured to determine plural types of control values to be designated to an integrated circuit that corresponds to the first light emitting element and the light receiving element, among the plurality of the integrated circuits, in accordance with a detection temperature detected by the temperature sensor; and
a light emission control unit configured to set a light emission state of an apparatus to which the light emission control unit belongs, to any of states 1 to 3 below, wherein the optical sub-assembly is disposed at one end side in the longitudinal direction with respect to a main heat generation member among the plurality of integrated circuits, and the temperature sensor is disposed at another end side in the longitudinal direction with respect to the heat generation member, the temperature control unit performs at least one of:
 a process of estimating a steady temperature of the first light emitting element and the light receiving element in the state 1 to 3, using the detection temperature detected by the temperature sensor as a reference; and
 a process of estimating a temperature change of the first light emitting element and the light receiving element associated with switching performed among the states 1 to 3, using the detection temperature detected by the temperature sensor as a reference, and state 1: a state in which the first light emitting element is ON and the second light emitting element is OFF;
state 2: a state in which the first light emitting element is ON and the second light emitting element is ON; and
state 3: a state in which the first light emitting element is OFF and the second light emitting element is ON.

* * * * *